United States Patent
Kumazawa et al.

(10) Patent No.: US 7,236,867 B2
(45) Date of Patent: Jun. 26, 2007

(54) SHORT-CIRCUIT DETECTING CIRCUIT DEVICE

(75) Inventors: Hidehiko Kumazawa, Nagoya (JP); Tatsuki Tanaka, Nagoya (JP)

(73) Assignee: DENSO Corporation, Kariya (JP)

( * ) Notice: Subject to any disclaimer, the term of this patent is extended or adjusted under 35 U.S.C. 154(b) by 391 days.

(21) Appl. No.: 11/004,906

(22) Filed: Dec. 7, 2004

(65) Prior Publication Data
US 2005/0165529 A1  Jul. 28, 2005

(30) Foreign Application Priority Data
Jan. 28, 2004  (JP)  ............................. 2004-020073

(51) Int. Cl.
*G06F 19/00* (2006.01)
(52) U.S. Cl. ............................. 701/45; 701/29; 702/58; 702/117; 340/438
(58) Field of Classification Search ................ 701/29, 701/34, 45, 63; 702/58, 59, 72, 116, 117, 702/118; 340/438
See application file for complete search history.

(56) References Cited

U.S. PATENT DOCUMENTS

| | | | | |
|---|---|---|---|---|
| 5,050,187 A | * | 9/1991 | Ichie | ........................... 375/257 |
| 5,166,880 A | * | 11/1992 | Furui | ........................... 701/45 |
| 5,227,984 A | * | 7/1993 | Meldrum et al. | ........... 702/117 |
| 5,521,832 A | * | 5/1996 | Kornhaas | ...................... 702/58 |
| 5,623,254 A | * | 4/1997 | Brambilla et al. | ........... 340/644 |
| 5,754,963 A | * | 5/1998 | Nunneley et al. | ............. 701/34 |
| 6,163,082 A | * | 12/2000 | Yoshida et al. | ............ 307/10.1 |
| 6,226,602 B1 | * | 5/2001 | Schmitt et al. | ............. 702/117 |
| 6,633,166 B1 | * | 10/2003 | Kaiser | ......................... 324/522 |
| 2006/0052957 A1 | * | 3/2006 | Hidehira | ...................... 702/58 |

FOREIGN PATENT DOCUMENTS
JP  A-2000-145005  5/2000

* cited by examiner

*Primary Examiner*—Gary Chin
(74) *Attorney, Agent, or Firm*—Posz Law Group, PLC

(57) ABSTRACT

In a circuit device for analyzing analog signals from first and second circuits. The first and second circuits are designed to output analog signals which are opposite to each other in the positive and negative signs of phase. When short-circuit occurs, the output signals from the first and second circuits interfere with each other and thus these signals are offset by each other, so that malfunction caused by the short-circuit can be prevented, and also neither a device not a terminal is required to be added.

6 Claims, 2 Drawing Sheets

SHORT-CIRCUIT DETECTING CIRCUIT DEVICE

CROSS REFERENCE TO RELATED APPLICATION

This application is based upon, claims the benefit of priority of, and incorporates by reference the contents of, Japanese Patent Application No. 2004-20073 filed on Jan. 28, 2004.

FIELD OF THE INVENTION

The present invention relates to a short-circuit detecting circuit device, and, more particularly, a short-circuit detecting circuit device usable in a self-diagnosis circuit for diagnosing normality/abnormality of an air-bag device sensor.

BACKGROUND OF THE INVENTION

With respect to an SRS air bag used in a vehicle, a G sensor detects an acceleration of a vehicle at all times, and an acceleration waveform thus achieved is converted to a digital code by an A/D converter and then subjected to operation processing in a computer. When the operation result satisfies a predetermined condition, a power transistor is turned on to supply current to a squib of an air bag module, thereby developing an air bag.

Furthermore, a safe sensor for opening and closing an electrical contact point is provided to a module ignition circuit in series by a mechanical structure, and the contact point is opened at a normal time to interrupt power supply to the module. When suffering an impact exceeding a set level, the contact point is closed and the power supply to the module is turned on.

Furthermore, the power transistor and the safe sensor are disposed while being allocated to the power source side and earth side of the module, thereby forming a "double separating" switch for separating both the power source side and earth side of the module from ECU. Accordingly, even when one side of a vehicle wire to the module is short-circuited to a power supply line or the body, an erroneous development of the air bag can be prevented.

An SRS air bag used in a vehicle is designed so that a self-diagnosis circuit is operated at the start time to detect presence or absence of abnormality of circuits. Since it is desired to detect at least crash decelerations of a vehicle in front-and-rear direction and right-and-left direction, generally, two or more G sensors are provided as disclosed in JP-A-2000-145005, for example. When plural G sensors are provided, it is desirable to provide a self-diagnosis circuit to each G sensor and detect the presence or absence of abnormality of the G sensor by each self-diagnosis circuit.

SUMMARY OF THE INVENTION

Accordingly, an object of the present invention is to provide a short-circuit detecting circuit device which can be miniaturized and reduce cost.

In order to attain the above object, a short-circuit detecting circuit device according to a first aspect includes a first circuit and a second circuit for outputting analog signals, a signal processor for processing output signals of the first and second circuits, a first conductive wire for connecting the first circuit and the signal processor, a second conductive wire for connecting the second circuit and the signal processor, and a short-circuit monitoring unit for analyzing at least one of the analog signals of the first and second circuits which are input to the signal processor and monitoring the short-circuit between the first conductive wire and the second conductive wire, wherein the analog signals output from the first and second circuits are opposite to each other in the positive and negative signs of phase.

It is preferable that the first and second circuits output the analog signals at the same time.

It is preferable that each of the first and second circuits is a self-diagnosis circuit for a G sensor in an air bag device, and also it is preferable that a self-diagnosis signal generator is further equipped, and the first and second circuits simultaneously output the analog signals in response to at least one trigger signal from a self-diagnosis signal generator.

It is preferable that the self-diagnosis signal generator generates two trigger signals and outputting the two trigger signals to the first and second circuit at the same time, or it is preferable that the self-diagnosis signal generator generates one trigger signal, and the trigger signal generated by the self-diagnosis signal generator is split to two trigger signals to be input to the first and second circuits at the same time.

Accordingly, in the short-circuit detecting circuit device of the first aspect, the presence or absence of the short-circuit between the first conductive wire and the second conductive wire can be judged by merely monitoring at least one of the output signal from the first circuit and the output signal from the second circuit. Accordingly, malfunction caused by short-circuit can be prevented, and neither device nor terminal is needed to be added, so that the device can be miniaturized and cost can be reduced.

In the short-circuit detecting circuit device described above, the first circuit and the second circuit output analog signals which are opposite to each other in the positive and negative signs of phase. Accordingly, even when the first conductive wire and the second conductive wire are short-circuited to each other, the above construction makes the output analog signals of the first and second circuits interfere with each other and thus they are offset by each other, so that both the output analog signals cannot reach predetermined amplitude. On the other hand, when no short-circuit occurs, both the output analog signals are kept to predetermined amplitude. Accordingly, the presence or absence of the short-circuit between the first conductive wire and the second conductive wire can be judged by merely monitoring any one of the output analog signals of the first and second circuits.

Various kinds of electrical circuits for home electric appliances, industrial equipment, vehicles, etc. may be considered as the first and second circuits. However, the present invention is particularly effective to circuits of an SRS air bag device of a vehicle for which miniaturization and reduction in cost are important problems. Furthermore, in the circuit of the SRS air bag device, a circuit for processing signals from external sensors which indispensably needs plural circuits, a circuit for processing signals from plural G sensors, a circuit for generating a pre-crash signal, etc. may be used as the first and second circuits. A comb-shaped electrostatic capacity type sensor is used as a G sensor. Therefore, the positive and negative signs of phase are easily inverted, and thus a sensor which has been hitherto used can be directly used.

The first and second circuits can output analog signals with some time lag. However, if the time lag is coincident with the phase shift, the offset based on the interference between the output analog signals would not occur. In this case, it is difficult to detect short-circuit. Therefore, it is desirable that the first and second circuits output analog signals at the same time. In order to satisfy this requirement, it may be designed that a trigger signal is generated from a self-diagnosis signal generator, and upon receiving the trigger signal, each of the first and second circuits generates an analog signal. Accordingly, the output signals of the first and second circuits can be surely made to interfere with each other when short-circuit occurs, and thus the short-circuit between the first conductive wire and the second conductive wire can be surely detected.

Furthermore, when no short-circuit occurs, the signal processor monitors the amplitude of each output signal to judge the presence or absence of abnormality of each of the first and second circuits. Accordingly, the first circuit and the second circuit merely output analog signals which are opposite to each other in the positive and negative signs of phase, and the amplitude of the values of the output signals is not particularly limited.

The signal processor may be constructed by an AD converter for converting an analog signal to a digital signal, and a microcomputer for subjecting the digital signal to operation processing, and it may be equipped to a part of ECU. A signal processor for processing the output signal of the first circuit and a signal processor for processing the output signal of the second circuit may be provided, or the output signals of the first and second circuits may be processed by one signal processor. The short-circuit monitoring unit may comprise a microcomputer different from the signal processor, however, it is desirable that the short-circuit monitoring unit is integral with the signal processor.

BRIEF DESCRIPTION OF THE DRAWINGS

The above and other objects, features and advantages of the present invention will become more apparent from the following detailed description made with reference to the accompanying drawings.

DETAILED DESCRIPTION OF THE PREFERRED EMBODIMENTS

Preferred embodiments according to the present invention will be described hereunder with reference to the accompanying drawings.

First Embodiment

Figure 1:
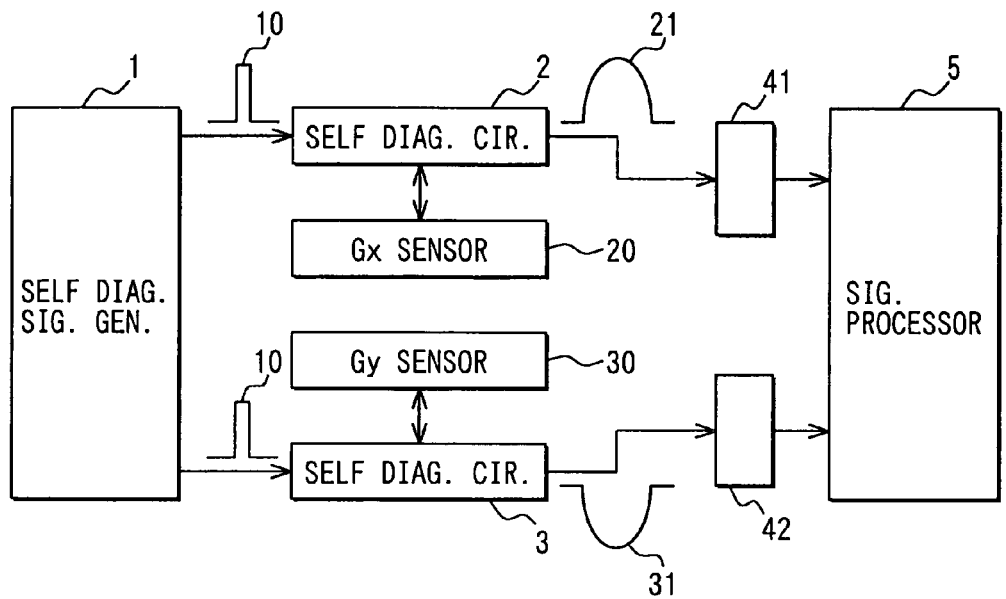
FIG. 1 is a block diagram showing the construction of a short-circuit detecting circuit device according to an embodiment of the present invention.
Figure 2:
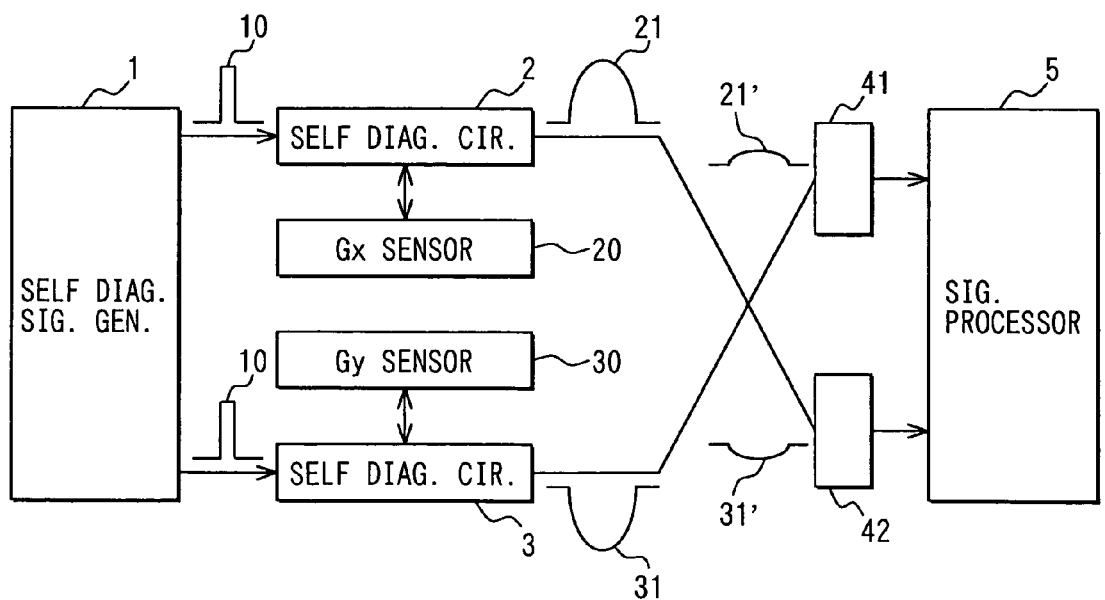
FIG. 2 is a block diagram showing the short-circuit detecting circuit device of the embodiment of the present invention when short-circuit occurs.

In this embodiment, the present invention is applied to a self-diagnosis circuit of a G sensor used in an SRS air bag device for a vehicle. FIGS. 1 and 2 are block diagrams showing a short-circuit detecting circuit device of this embodiment. The short-circuit detecting circuit device comprises a self-diagnosis signal generator 1, Gx and Gy sensors 20 and 30, a self-diagnosis circuit 2 (first circuit), a self-diagnosis circuit 3 (second circuit), A/D converters 41 and 42, and a signal processor 5. The short-circuit detecting circuit device is disposed in ECU. The signal processor 5 constitutes a signal processor and a short-circuit monitoring unit. Conductive wires through which the self-diagnosis circuit 2 and the self-diagnosis circuit 3 are connected to the A/D converters 41 and 42 constitute first and second conductive wires in the present invention.

The self-diagnosis signal generator 1 generates trigger signals 10 when the engine is started. The trigger signals 10 are output to the self-diagnosis circuit 2 and the self-diagnosis circuit 3 substantially at the same time. In response to the trigger signal 10, the self-diagnosis circuit 2 communicates with the Gx sensor 20 for detecting the deceleration of the vehicle in the X-direction corresponding to the front-and-rear direction, and outputs an analog signal 21 having a positive phase in accordance with the stat of the Gx sensor 20. Furthermore, in response to the other trigger signal 10, the self-diagnosis circuit 3 communicates with the Gy sensor 30 for detecting the deceleration of the vehicle in the Y-direction corresponding to the right and left direction, and outputs an analog signal 31 having a negative phase in accordance with the state of the Gy sensor 30.

The analog signals 21 and 31 output from the self-diagnosis circuit 2 and the self-diagnosis circuit 3 are converted to digital signals input to the A/D converters 41 and 42, and input to the signal processor 5 comprising a microcomputer.

In the signal processor 5, the digital output value of one of the output signals of the self-diagnosis circuit 2 and the self-diagnosis circuit 3 is first compared with a predetermined value. If the output value is smaller than the predetermined value, it is judged that a short-circuit has occurred between the conductive wires of the self-diagnosis circuits 2, 3 and the A/D converters 41, 42, and the fact that the short-circuit concerned has occurred is displayed on a panel (not shown) and the processing is finished.

As shown in FIG. 2, when short-circuit occurs between the conductive wires of the self-diagnosis circuits 2, 3 and the A/D converters 41, 42, the analog signals 21 and 31 which are opposite to each other in the positive and negative signs of phase interfere with each other and thus are offset by each other. Therefore, both the digital output values of the self-diagnosis circuits 2 and 3 are reduced to smaller analog signals 21' and 31', respectively. Accordingly, the presence or absence of short-circuit can be surely judged by merely monitoring only one of the output values of the self-diagnosis circuits 2 and 3.

On the other hand, when the digital output value is not less than the predetermined value, it is judged that no short-circuit occurs, and the signal processor 5 judges the magnitude between the digital output values of the self-diagnosis circuits 2 and 3. The difference in magnitude therebetween is calculated, and if the calculation result is within a predetermined range, it is judged that both the Gx sensor 20 and the Gy sensor 30 are normal. If the difference is outside of the predetermined range, an abnormal sensor is identified on the basis of the comparison between the digital output values of the sensors, and this fact is displayed on the panel (not shown) and the processing is finished.

That is, according to the short-circuit detecting circuit device of this embodiment, the presence or absence of the short-circuit between the conductive wires of the self-diagnosis circuits 2, 3 and the A/D converters 41, 42 can be detected by directly using self-diagnosis devices for diagnosing the abnormality of the Gx sensor 20 and the Gy sensor 30, respectively. Accordingly, no terminal is required to be added, so that the device can be miniaturized, and also increase of the cost can be controlled.

Second Embodiment

Figure 3:
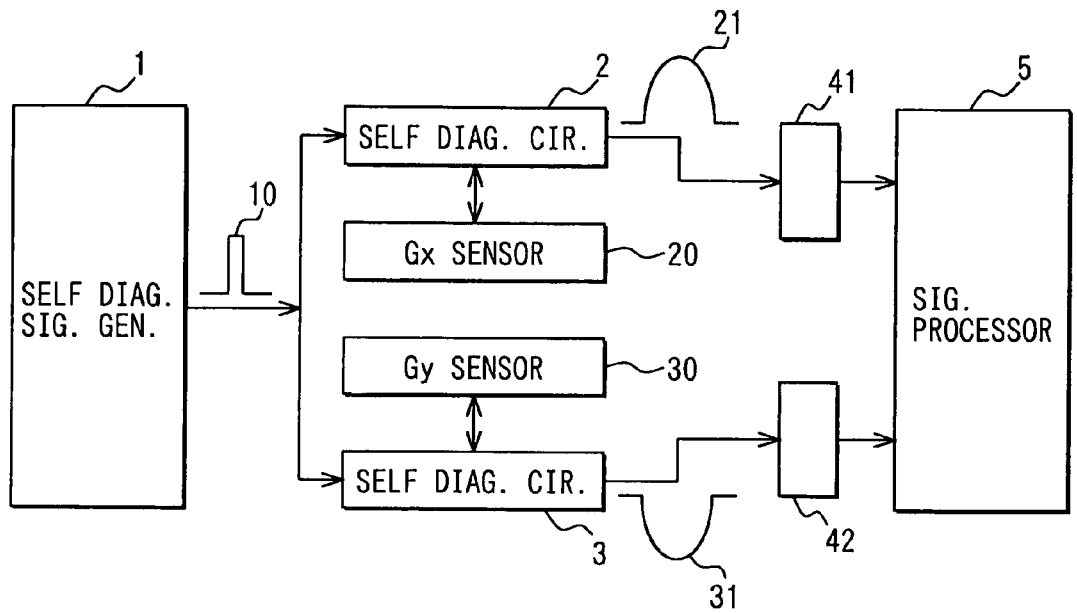
FIG. 3 is a block diagram showing the construction of a short-circuit detecting circuit device according to a second embodiment of the present invention.

Referring to FIG. 3, a second embodiment of the short-circuit detecting circuit device of this embodiment will be discussed. The short-circuit detecting device of this embodiment is similar to the first embodiment except that the trigger signal 10 from the self-diagnosis generator 1 is split and output to the self-diagnosis circuit 2 and the self-diagnosis circuit 3 at the same time.

According to the short-circuit detecting circuit device of this embodiment, the analog signals output from the self-diagnosis circuits 2 and 3 can be surely generated at the same time. Accordingly, when short-circuit occurs, the two analog signals are surely made to interfere with each other and thus offset by each other, so that the precision of the detection as to the presence or absence of short-circuit can be further enhanced.

Figure 4:
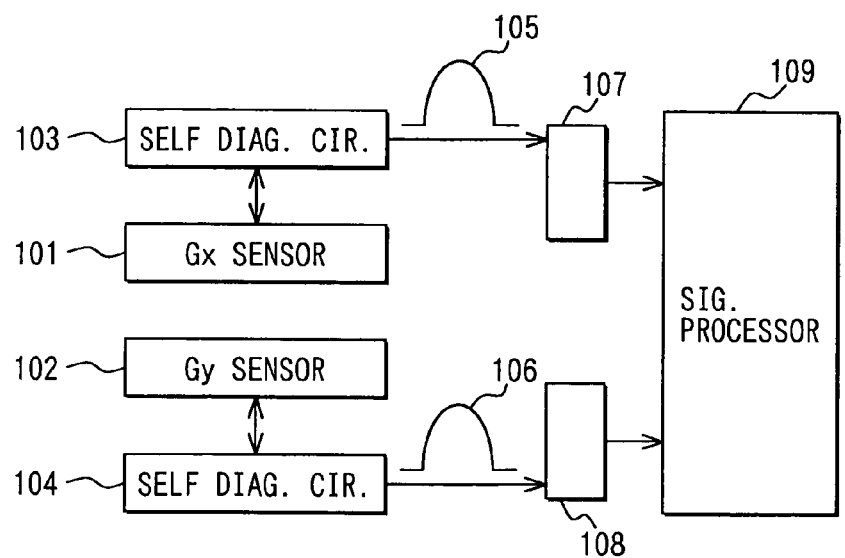
FIG. 4 is a block diagram showing the construction of a related art short-circuit detecting circuit device.

Referring to FIG. 4, a related art self-diagnosis system will be discussed. This self-diagnosis system is equipped with a Gx sensor 101 for detecting the deceleration in the X-direction corresponding to the front-and-rear direction of a vehicle and a Gy sensor 102 for detecting the deceleration in the Y direction corresponding to the right-and-left direction of the vehicle. When the engine is started, a self-diagnosis circuit 103 and a self-diagnosis circuit 104 communicate with the Gx sensor 101 and the Gy sensor 102 respectively to start self-diagnosis, and output diagnosis results as analog signals 105 and 106, respectively. The respective output signals are input to a signal processor 109 through A/D converters 107 and 108 respectively, and the signal processor 109 compares the input signals with each other. If any difference in magnitude exceeding a predetermined range exists between the input signals, it can be judged that at least one of the Gx sensor 101 and the Gy sensor 102 is abnormal.

When electrically conductive dust or the like adheres to an IC terminal or the like, the output terminals of the self-diagnosis circuit 103 and the self-diagnosis circuit 104 may be short-circuited to each other, resulting in occurrence of malfunction. However, in the self-diagnosis system as described above, it is difficult to detect the short-circuit concerned, and in order to detect the short-circuit, it is needed to monitor the output signals of plural self-diagnosis circuits 103 and 104 and also add a device and terminals for detecting the short-circuit. Accordingly, there is such a disadvantage that the device must be designed in a large scale, and the cost rises up.

In comparison, in the first and second embodiments discussed above, the presence or absence of short-circuit can be surely judged by merely monitoring only one of the output values of the self-diagnosis circuits 2 and 3.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A short-circuit detecting circuit device comprising:
   a first circuit and a second circuit for outputting analog signals;
   a signal processor for processing output signals of the first and second circuits;
   a first conductive wire for connecting the first circuit and the signal processor;
   a second conductive wire for connecting the second circuit and the signal processor; and
   a short-circuit monitoring unit for analyzing at least one of the analog signals of the first and second circuits which are input to the signal processor and monitoring the short-circuit between the first conductive wire and the second conductive wire, wherein the analog signals output from the first and second circuits are opposite in phase to each other.

2. The short-circuit detecting circuit device according to claim 1, wherein the first and second circuits output the analog signals at the same time.

3. The short-circuit detecting circuit device according to claim 1, wherein each of the first and second circuits is a self-diagnosis circuit for a G sensor in an air bag device.

4. The short-circuit detecting circuit device according to claim 2, further comprising a self-diagnosis signal generator for generating at least one trigger signal, wherein the first and second circuits simultaneously output the analog signals in response to the at least one trigger signal from the self-diagnosis signal generator.

5. The short-circuit detecting circuit device according to claim 4, wherein the self-diagnosis signal generator generates two trigger signals and outputs the two trigger signals to the first and second circuit at the same time.

6. The short-circuit detecting circuit device according to claim 4, wherein the self-diagnosis signal generator generates one trigger signal, and then said one trigger signal generated by the self-diagnosis signal generator is split to two trigger signals to be input to the first and second circuits at the same time.

* * * * *